(12) United States Patent
Grimbergen

(10) Patent No.: US 8,778,204 B2
(45) Date of Patent: *Jul. 15, 2014

(54) METHODS FOR REDUCING PHOTORESIST INTERFERENCE WHEN MONITORING A TARGET LAYER IN A PLASMA PROCESS

(75) Inventor: Michael N. Grimbergen, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 217 days.

This patent is subject to a terminal disclaimer.

(21) Appl. No.: 13/281,989

(22) Filed: Oct. 26, 2011

(65) Prior Publication Data

US 2012/0103936 A1 May 3, 2012

Related U.S. Application Data

(60) Provisional application No. 61/408,062, filed on Oct. 29, 2010, provisional application No. 61/408,322, filed on Oct. 29, 2010.

(51) Int. Cl.
*H01L 21/66* (2006.01)

(52) U.S. Cl.
USPC .......... 216/60; 216/41; 216/49; 216/67; 216/75; 438/9; 438/720; 438/742

(58) Field of Classification Search
None
See application file for complete search history.

(56) References Cited

U.S. PATENT DOCUMENTS

| 4,058,430 A | 11/1977 | Suntola et al. |
| 4,389,973 A | 6/1983 | Suntola et al. |
| 4,413,022 A | 11/1983 | Suntola et al. |
| 4,834,831 A | 5/1989 | Nishizawa et al. |
| 4,993,357 A | 2/1991 | Scholz |
| 5,225,366 A | 7/1993 | Yoder |
| 5,281,274 A | 1/1994 | Yoder |
| 5,294,286 A | 3/1994 | Nishizawa et al. |
| 5,374,570 A | 12/1994 | Nasu et al. |
| 5,441,703 A | 8/1995 | Jurgensen |
| 5,443,647 A | 8/1995 | Aucoin et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,674,786 A | 10/1997 | Turner et al. |
| 5,711,811 A | 1/1998 | Suntola et al. |
| 5,733,820 A * | 3/1998 | Adachi et al. ............ 438/719 |
| 5,773,316 A * | 6/1998 | Kurosaki et al. ............ 438/16 |
| 5,786,886 A * | 7/1998 | Litvak et al. ............ 356/72 |
| 5,796,116 A | 8/1998 | Nakata et al. |
| 5,807,792 A | 9/1998 | Ilg et al. |
| 5,835,677 A | 11/1998 | Li et al. |
| 5,855,680 A | 1/1999 | Soininen et al. |
| 5,866,795 A | 2/1999 | Wang et al. |
| 5,879,459 A | 3/1999 | Gadgil et al. |
| 5,916,365 A | 6/1999 | Sherman |
| 5,923,056 A | 7/1999 | Lee et al. |
| 6,015,590 A | 1/2000 | Suntola et al. |
| 6,015,917 A | 1/2000 | Bhandari et al. |
| 6,042,652 A | 3/2000 | Hyun et al. |

(Continued)

*Primary Examiner* — Anita Alanko
(74) *Attorney, Agent, or Firm* — Patterson & Sheridan, LLP

(57) ABSTRACT

A method and apparatus for monitoring a target layer in a plasma process having a photoresist layer is provided. The method is useful in removing noise associated with the photoresist layer, and is particularly useful when signals associated with the target layer is weak, such as when detecting an endpoint for a photomask etching process.

20 Claims, 6 Drawing Sheets

(56) References Cited

U.S. PATENT DOCUMENTS

| | | | |
|---|---|---|---|
| 6,084,302 A | 7/2000 | Sandhu | |
| 6,124,158 A | 9/2000 | Dautartas et al. | |
| 6,139,700 A | 10/2000 | Kang et al. | |
| 6,144,060 A | 11/2000 | Park et al. | |
| 6,159,297 A | 12/2000 | Herchen et al. | |
| 6,174,377 B1 | 1/2001 | Doering et al. | |
| 6,174,809 B1 | 1/2001 | Kang et al. | |
| 6,183,563 B1 | 2/2001 | Choi et al. | |
| 6,197,683 B1 | 3/2001 | Kang et al. | |
| 6,200,893 B1 | 3/2001 | Sneh | |
| 6,203,613 B1 | 3/2001 | Gates et al. | |
| 6,207,487 B1 | 3/2001 | Kim et al. | |
| 6,231,672 B1 | 5/2001 | Choi et al. | |
| 6,270,572 B1 | 8/2001 | Kim et al. | |
| 6,284,646 B1 | 9/2001 | Leem | |
| 6,287,965 B1 | 9/2001 | Kang et al. | |
| 6,305,314 B1 | 10/2001 | Sneh et al. | |
| 6,306,216 B1 | 10/2001 | Kim et al. | |
| 6,342,277 B1 | 1/2002 | Sherman | |
| 6,348,376 B2 | 2/2002 | Lim et al. | |
| 6,358,629 B1 | 3/2002 | Aga | |
| 6,372,598 B2 | 4/2002 | Kang et al. | |
| 6,379,748 B1 | 4/2002 | Bhandari et al. | |
| 6,391,785 B1 | 5/2002 | Satta et al. | |
| 6,399,491 B2 | 6/2002 | Jeon et al. | |
| 6,416,577 B1 | 7/2002 | Suntoloa et al. | |
| 6,416,822 B1 | 7/2002 | Chiang et al. | |
| 6,428,859 B1 | 8/2002 | Chiang et al. | |
| 6,447,607 B2 | 9/2002 | Soininen et al. | |
| 6,448,094 B2 * | 9/2002 | Yamazawa et al. | 438/9 |
| 6,451,119 B2 | 9/2002 | Sneh et al. | |
| 6,451,695 B2 | 9/2002 | Sneh | |
| 6,475,910 B1 | 11/2002 | Sneh | |
| 6,478,872 B1 | 11/2002 | Chae et al. | |
| 6,481,945 B1 | 11/2002 | Hasper et al. | |
| 6,482,262 B1 | 11/2002 | Elers et al. | |
| 6,482,733 B2 | 11/2002 | Raaijmakers et al. | |
| 6,511,539 B1 | 1/2003 | Raaijmakers | |
| 6,551,406 B2 | 4/2003 | Kilpi | |
| 6,749,974 B2 | 6/2004 | Chan | |
| 6,903,826 B2 * | 6/2005 | Usui et al. | 356/504 |
| 7,204,934 B1 * | 4/2007 | Braly et al. | 216/59 |
| 7,372,582 B2 * | 5/2008 | Negishi et al. | 356/625 |
| 7,771,895 B2 | 8/2010 | Wu et al. | |
| 8,092,695 B2 * | 1/2012 | Grimbergen | 216/12 |
| 2001/0000866 A1 | 5/2001 | Sneh et al. | |
| 2001/0002280 A1 | 5/2001 | Sneh | |
| 2001/0009140 A1 | 7/2001 | Bondestam et al. | |
| 2001/0009695 A1 | 7/2001 | Saanila et al. | |
| 2001/0011526 A1 | 8/2001 | Doering et al. | |
| 2001/0013312 A1 | 8/2001 | Soininen et al. | |
| 2001/0014371 A1 | 8/2001 | Kilpi | |
| 2001/0024387 A1 | 9/2001 | Raaijmakers et al. | |
| 2001/0025979 A1 | 10/2001 | Kim et al. | |
| 2001/0028924 A1 | 10/2001 | Sherman | |
| 2001/0034123 A1 | 10/2001 | Jeon et al. | |
| 2001/0041250 A1 | 11/2001 | Werkhoven et al. | |
| 2001/0042523 A1 | 11/2001 | Kesala | |
| 2001/0042799 A1 | 11/2001 | Kim et al. | |
| 2001/0054377 A1 | 12/2001 | Lindfors et al. | |
| 2001/0054730 A1 | 12/2001 | Kim et al. | |
| 2001/0054769 A1 | 12/2001 | Raaijmakers et al. | |
| 2002/0000196 A1 | 1/2002 | Park | |
| 2002/0000598 A1 | 1/2002 | Kang et al. | |
| 2002/0007790 A1 | 1/2002 | Park | |
| 2002/0009544 A1 | 1/2002 | McFeely et al. | |
| 2002/0020869 A1 | 2/2002 | Park et al. | |
| 2002/0021544 A1 | 2/2002 | Cho et al. | |
| 2002/0031618 A1 | 3/2002 | Sherman | |
| 2002/0041931 A1 | 4/2002 | Suntola et al. | |
| 2002/0048635 A1 | 4/2002 | Kim et al. | |
| 2002/0052097 A1 | 5/2002 | Park | |
| 2002/0066411 A1 | 6/2002 | Chiang et al. | |
| 2002/0068458 A1 | 6/2002 | Chiang et al. | |
| 2002/0073924 A1 | 6/2002 | Chiang et al. | |
| 2002/0076481 A1 | 6/2002 | Chiang et al. | |
| 2002/0076507 A1 | 6/2002 | Chiang et al. | |
| 2002/0076837 A1 | 6/2002 | Hujanen et al. | |
| 2002/0086106 A1 | 7/2002 | Park et al. | |
| 2002/0092471 A1 | 7/2002 | Kang et al. | |
| 2002/0094689 A1 | 7/2002 | Park | |
| 2002/0098627 A1 | 7/2002 | Pomarede et al. | |
| 2002/0104481 A1 | 8/2002 | Chiang et al. | |
| 2002/0106536 A1 | 8/2002 | Lee et al. | |
| 2002/0134307 A1 | 9/2002 | Choi | |
| 2002/0144655 A1 | 10/2002 | Chiang et al. | |
| 2002/0146511 A1 | 10/2002 | Chiang et al. | |
| 2002/0155722 A1 | 10/2002 | Satta et al. | |
| 2002/0162506 A1 | 11/2002 | Sneh et al. | |
| 2002/0164421 A1 | 11/2002 | Chiang et al. | |
| 2002/0164423 A1 | 11/2002 | Chiang et al. | |
| 2002/0177282 A1 | 11/2002 | Song | |
| 2002/0182320 A1 | 12/2002 | Leskela et al. | |
| 2002/0187256 A1 | 12/2002 | Elers et al. | |
| 2002/0197402 A1 | 12/2002 | Chiang et al. | |
| 2003/0013320 A1 | 1/2003 | Kim et al. | |
| 2003/0031807 A1 | 2/2003 | Elers et al. | |
| 2003/0042630 A1 | 3/2003 | Babcoke et al. | |
| 2003/0049942 A1 | 3/2003 | Haukka et al. | |
| 2003/0072975 A1 | 4/2003 | Shero et al. | |
| 2003/0075273 A1 | 4/2003 | Kilpela et al. | |
| 2003/0075925 A1 | 4/2003 | Lindfors et al. | |
| 2004/0035529 A1 * | 2/2004 | Grimbergen | 156/345.24 |
| 2005/0029228 A1 * | 2/2005 | Nozawa et al. | 216/60 |

* cited by examiner

METHODS FOR REDUCING PHOTORESIST INTERFERENCE WHEN MONITORING A TARGET LAYER IN A PLASMA PROCESS

CROSS-REFERENCE TO RELATED APPLICATIONS

This application claims benefit of U.S. Provisional Application Ser. No. 61/408,062 filed Oct. 29, 2010 and U.S. Provisional Application Ser. No. 61/408,322, filed Oct. 29, 2010, both of which are incorporated by reference in their entirety.

BACKGROUND OF THE INVENTION

1. Field of the Invention

Embodiments of the present invention generally relate to methods to reduce photoresist interference in an endpoint detection process for the fabrication of photomasks useful in the manufacture of integrated circuits.

2. Description of the Related Art

The fabrication of microelectronics or integrated circuit devices typically involves a complicated process sequence requiring hundreds of individual steps performed on semiconductor, dielectric and conductive substrates. Examples of these process steps include oxidation, diffusion, ion implantation, thin film deposition, cleaning, etching and lithography. Using lithography and etching (often referred to as pattern transfer steps), a desired pattern is first transferred to a photosensitive material layer, e.g., a photoresist, and then to the underlying material layer during subsequent etching. In the lithographic step, a blanket photoresist layer is exposed to a radiation source through a reticle or photomask containing a pattern so that an image of the pattern is formed in the photoresist. By developing the photoresist in a suitable chemical solution, portions of the photoresist are removed, thus resulting in a patterned photoresist layer. With this photoresist pattern acting as a mask, the underlying material layer is exposed to a reactive environment, e.g., using wet or dry etching, which results in the pattern being transferred to the underlying material layer.

The pattern on a photomask, which is typically formed in a metal-containing layer supported on a glass or quartz substrate, is also generated by etching through a photoresist pattern. In this case, however, the photoresist pattern is created by a direct write technique, e.g., with an electron beam or other suitable radiation beam, as opposed to exposing the photoresist through a reticle. With the patterned photoresist as a mask, the pattern can be transferred to the underlying metal-containing layer using plasma etching. An example of a commercially available photomask etch equipment suitable for use in advanced device fabrication is the Tetra™ Photomask Etch System, available from Applied Materials, Inc., of Santa Clara, Calif. The terms "mask", "photomask" or "reticle" will be used interchangeably to denote generally a substrate containing a pattern.

During processing, endpoint data from the etching of the photomasks may be used to determine whether the process is operating according to required specifications, and whether the desired results such as etch uniformity are achieved. Since each photomask generally has its own set of features or patterns, different photomasks being etched using the same process recipe may yield different endpoint data, thereby making it difficult to determine if the desired etch results are obtained for a specific photomask. Furthermore, during an etching process, the etching rate for etching the photoresist layer and the photomask may be different. Accordingly, when directing a radiation to the photoresist layer and the photomask, different thickness variation between the photoresist layer and the photomask may generate different reflective or transmissive signal to the endpoint data, therefore, making it even more difficult to determine an accurate endpoint for the photomask etching process without interfered by the photoresist thickness variation.

FIGS. 1A-1B depicts exemplary embodiments of a conventional method to detect an etch endpoint for a photomask etching process. Generally, the photomask 100 includes a metal layer 106 disposed on a phase shifting material layer 104 on a quartz substrate 102. A patterned photoresist layer 108 may be formed on the metal layer 106 utilized to transfer features onto the metal 106 and/or phase shifting material layer 104. In the case that transmissive signals are used by an endpoint detection system to collect an endpoint data, not only a first transmissive signal T1' passing through the photoresist layer 108 is detected, but also a second transmissive signal T2' passing through the metal layer 106 is also detected. Since the first transmissive signal T1' may interfere with accurately analyzing the second transmissive signal T2', precise endpoint detection is difficult, particularly in thin metal layer etching processes such as in photomask applications wherein the change in transmission may be same as the endpoint nears. Similarly, when reflective signals are utilized in a endpoint detection process, as shown in FIG. 1B, a first reflective signal R1' interfacing the photoresist may interfere with a second reflective signal R2' interfacing solely with the target material being etched through an opening in the photoresist, also making the endpoint detection difficult to precisely determine.

Therefore, there is an ongoing need for improved endpoint detection particularly for photomask fabrication.

SUMMARY OF THE INVENTION

One embodiment of the invention provides an apparatus and methods for monitoring a target material during a plasma process. In some embodiments, the method may advantageously utilized for determining an endpoint for a photomask etching process with minimum interface between the photoresist layer and photomask during the photomask etching process.

In one embodiment, a method for monitoring a target material during a plasma process includes directing, during a plasma process on a substrate having a target material and a patterned photoresist layer disposed thereon, an optical signal to a surface of the substrate; collecting the optical signal interfaced with the substrate surface, the collected optical signal including at least a first wavelength and a second wavelength, wherein the first wavelength has a signal characteristic inverse of a signal characteristic of the second wavelength; reducing a contribution of a portion of the collected optical signal interfaced with the photoresist layer from the collected optical signal to leave a resultant signal primarily composed of the portion of the optical signal interfaced with the target layer; and determining an etch endpoint or thickness of the target layer from the resultant signal.

In one embodiment, a method for monitoring a target material during a plasma process includes directing an optical signal to a substrate surface in a plasma process, collecting the optical signal interfaced with the substrate surface at least a first wavelength and a second wavelength, reducing a contribution of a portion of the collected optical signal interfaced with a photoresist layer from the collected optical signal by summing a characteristic of the optical signal interfaced with a photoresist layer to about zero to leave a resultant signal primarily composed of the portion of the optical signal interfaced with a target layer, and determining an etch endpoint or thickness of the target layer from the resultant signal.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for monitoring a target layer in a plasma process having a photoresist layer. In one embodiment, the method is useful in removing unwanted signal associated with the photoresist layer, and is particularly useful when signals associated with the target layer are weak, such as when detecting an endpoint for a photomask etching process. The endpoint detection process can efficiently reduce signal interference passing through a photoresist layer disposed on the photomask. Although the discussions and illustrative examples focus on the etching of a photomask structure, various embodiments of the invention can also be adapted for process monitoring of other suitable substrates, including transparent or dielectric substrates or other semiconductor wafers. As utilized herein, the term "interfaced" refers to an optical signal that is transmitted through, or reflected from, a surface.

Figure 2:
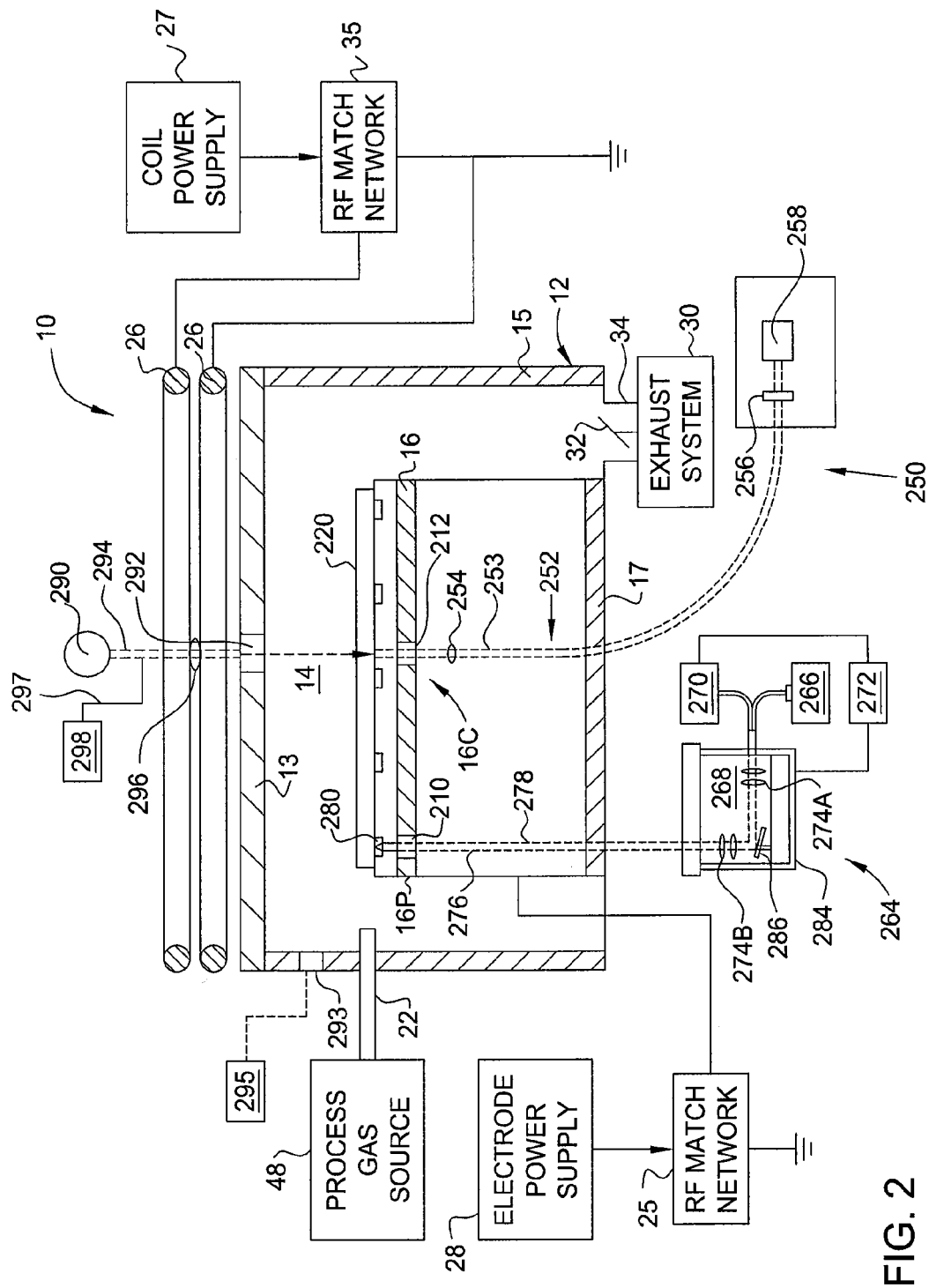
FIG. 2 illustrates a process chamber incorporating one embodiment of the present invention.

FIG. 2 is a schematic cross sectional view of a plasma etch chamber 10 in accordance with one embodiment of the invention. Suitable plasma etch chambers include the Tetra™ II photomask etch chamber or the Decoupled Plasma Source (DPS™) chamber available from Applied Materials, Inc., of Santa Clara, Calif. Other process chambers may also be used in connection with embodiments of the invention, including, for example, capacitive coupled parallel plate chambers and magnetically enhanced ion etch chambers, as well as inductively coupled plasma etch chambers of different designs. The particular embodiment of the etch chamber 10 shown herein is provided for illustrative purposes and should not be used to limit the scope of the invention. It is contemplated that the invention may be utilized in other processing systems, including those from other manufacturers.

Figure 1A:
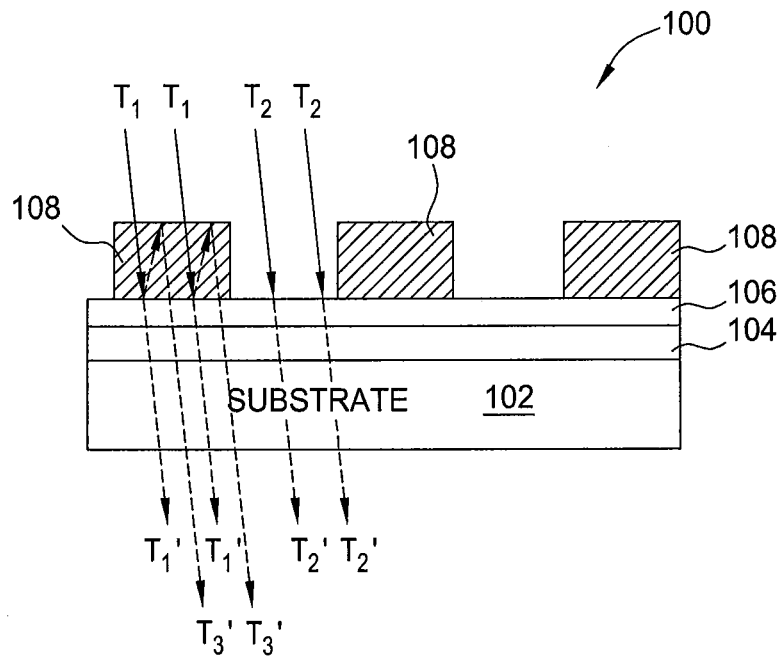
FIGS. 1A-1B illustrates cross-sectional view of a photomask during an endpoint detection process.
Figure 1B:
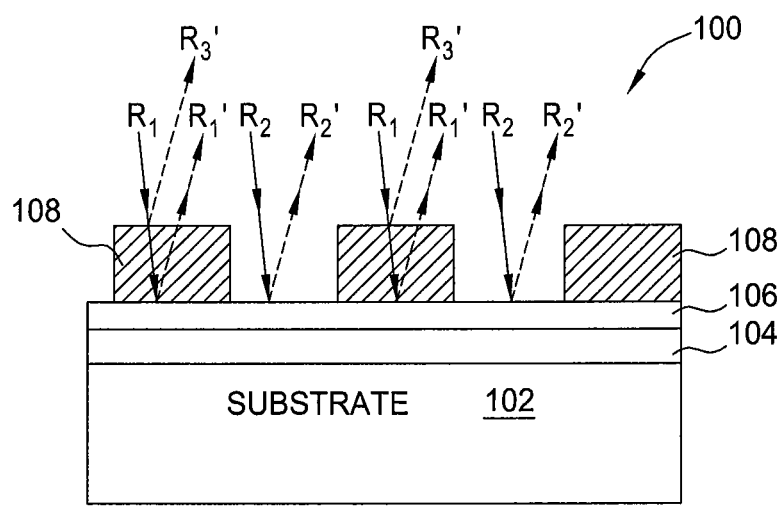

The process chamber 10 generally includes a cylindrical sidewall or chamber body 12, an energy transparent ceiling 13 mounted on the body 12, and a chamber bottom 17. The ceiling 13 may be flat, rectangular, arcuate, conical, dome or multi-radius shaped. At least one inductive coil 26 is disposed above at least a portion of the ceiling 13. In the embodiment depicted in FIG. 1A, two concentric coils 26 are shown. The chamber body 12 and the chamber bottom 17 of the process chamber 10 can be made of a metal, such as anodized aluminum, and the ceiling 13 can be made of an energy transparent material such as a ceramic or other dielectric material.

A substrate support member 16 is disposed in the process chamber 10 to support a substrate 220 during processing. The support member 16 may be a conventional mechanical or electrostatic chuck with at least a portion of the support member 16 being electrically conductive and capable of serving as a process bias cathode. While not shown, a photomask adapter may be used to secure the photomask on the support member 16. The photomask adapter generally includes a lower portion milled to cover an upper portion of the support member and a top portion having an opening that is sized and shaped to hold a photomask. In one embodiment, the top portion of the photomask adapter has a square opening. A suitable photomask adapter is disclosed in U.S. Pat. No. 6,251,217, issued on Jun. 26, 2001, which is incorporated herein by reference to the extent not inconsistent with aspects and claims of the invention.

Process gases are introduced into the process chamber 10 from a process gas source 48 through a gas distributor 22 peripherally disposed about the support member 16. Mass flow controllers (not shown) for each process gas, or alternatively, for mixtures of the process gas, are disposed between the process chamber 10 and the process gas source 48 to regulate the respective flow rates of the process gases.

A plasma zone 14 is defined by the process chamber 10, the substrate support member 16 and the ceiling 13. A plasma is generated in the plasma zone 14 from the process gases by supplying power from a power supply 27 to the inductive coils 26 through an RF match network 35. The support member 16 may include an electrode disposed therein, which is powered by an electrode power supply 28 and generates a capacitive electric field in the process chamber 10 through an RF match network 25. Typically, RF power is applied to the electrode in the support member 16 while the body 12 is electrically grounded. The capacitive electric field, which is transverse to the plane of the support member 16, influences the directionality of charged species to provide more anisotropic etching of the substrate 220.

Process gases and etchant byproducts are exhausted from the process chamber 10 through an exhaust port 34 to an exhaust system 30. The exhaust system 30 may be disposed in the bottom 17 of the process chamber 10 or may be disposed in the body 12 of the process chamber 10 for removal of process gases. A throttle valve 32 is provided in the exhaust port 34 for controlling the pressure in the process chamber 10.

FIG. 2 further illustrates an endpoint detection system 264 operatively coupled to the process chamber 10 in accordance with one embodiment of the invention. According to embodiments of the invention, at least two optical access ports or viewports, are provided in different regions of the substrate support member 16. In the example shown in FIG. 2, the two optical access ports comprise respectively a window 210 at a peripheral region 16P, and a window 212 at a central region 16C. The endpoint detection system 264 is configured to detect optical signals through these windows, which allows optical monitoring of various locations on a photomask substrate 220 from its backside during etching. In one embodiment, a third window (not shown) may also be provided in the peripheral region 16P of the substrate support member 16. Alternatively, different numbers of windows may be provided at other locations of the substrate support member 16.

In general, a larger window facilitates the installation of optical components within the substrate support member 16. However, for apparatus in which the substrate support member 16 is RF biased, the size of the window, especially in the central region 16C of the substrate support member 16, is selected to be sufficiently large for optical monitoring, yet small enough to avoid potential adverse impact for the RF bias. Selecting a small window also improves the lateral temperature uniformity of the support member 16. The optical access port may generally comprise a flat window made of quartz or other materials that transmit light over a broad wavelength spectrum. A more detailed discussion of different optical configurations will be provided in a later section.

The endpoint detection system 264 comprises optical setup for operating in reflection or transmission modes, and is configured for different types of measurements such as reflectance or transmittance, interferometry, or optical emission spectroscopy. Depending on the application of interest, e.g., the material layers or substrate structure being processed, endpoints may be detected based on a change in the reflectance or transmittance intensities, the number of interference fringes, or changes in optical emission intensities at specific wavelengths, or a combination thereof.

The optical setup of the endpoint detection system 264 in a reflection mode of operation allows reflectance (or reflectometry) and interferometric measurement to be performed. The endpoint system 264 generally comprises an optical source 266, a focusing assembly 268 for focusing an incident optical beam 276 having at least two wavelengths from the optical source 266 onto an spot or area 280 on the backside of substrate 220, and a photodetector 270 for measuring the intensity of a return optical beam 278 reflected off the area 280 of the substrate 220.

The optical setup of the endpoint detection system 264 in a transmission mode of operation may include an optical source 266 positioned to direct an optical signal through substrate 220 to the photodetector 270. Optionally, the optical source 266 may be the plasma utilized to perform the etch process. Alternatively, another optical source 290 may be positioned above the chamber in transmission mode of operation to direct an optical signal through substrate 220 to the photodetector 270 as needed.

The photodetector 270 may be multi-wavelength detector, or a spectrometer. Based on the measured signals of the reflected optical beam 278, a computer system 272 removes interference attributed to the signal interfaced with the photoresist, calculates portions of the real-time waveform and compares it with a stored characteristic waveform pattern to extract information relating to the etch process. In this case, the calculation may be based on slope changes or other characteristic changes in the detected signals, either in reflection or transmission mode, for example, when a film is etched through. Alternatively, the calculation may be based on interferometric signals as the depth of a trench or the thickness of a film changes during etching. In other embodiments, more detailed calculations may be performed based on reflection and transmission data obtained over a wide spectrum in order to determine the depth or thickness at any point in the etch process, or to determine the lateral dimensions of the features being etched.

The light source 266 provides a signal having at least first wavelength and a second wavelength. The first and second wavelengths are selected such that a signal characteristic of the first wavelength interfacing with a photoresist layer is the inverse of a signal characteristic of the second wavelength interfacing with the photoresist layer. The signal characteristic may be intensity or polarization as needed. The inverse characteristic is utilized to cancel out the effect or interference with the signal interfacing with the photoresist layer to leave a resultant signal primarily composed of the portion of the optical signal interfaced with a target being etch. As the resultant signal has less noise, a more precise and accurate determination of an etch endpoint or thickness of the target material may be realized. For applications having a photoresist layer greater than or equal to about 400 A, the second wavelength is selected to have a wavelength about or equal to twice the wavelength of the first wavelength. For applications having a photoresist layer less than about 400 A, the second wavelength is selected to have a wavelength which has in signal inverse characteristic of that of the first wavelength, which may be empirically found or calculated using transmission constants.

The light source 266 (which may be include multiple individual light sources), may be polychromatic, white light, or other light source suitable for providing light in the at least first and second wavelengths. In general, the optical signal from the reflected beam 278 may be analyzed to extract information regarding the presence or absence of a layer (e.g., metal-containing layer), or the thickness of certain material layers within the area 280. The intensity of the incident light beam 276 is selected to be sufficiently high to provide a return beam 278 with a measurable intensity. The lamp can also be switched on and off to subtract background light such as from the plasma. In one embodiment, the light source 266 provides polychromatic light, e.g., from an Hg—Cd lamp or a light emitting diode (LED), which generates light in a wavelength range from about 200 nm to about 800 nm, or about 400 to 800 nm, respectively. The polychromatic light source 266 can be filtered to provide an incident light beam 276 having selected frequencies. Color filters can be placed in front of the photodetector 270 to filter out all wavelengths except for the desired wavelengths of light, prior to measuring the intensity of the return light beam 278 entering the photodetector 270. The light can be analyzed by a spectrometer (array detector with a wavelength-dispersive element) to provide data over a wide wavelength range, such as ultraviolet to visible, from about 200 nm to 800 nm. The light source 266 can also comprise a flash lamp, e.g., a Xe or other halogen lamp, or a monochromatic light source that provides optical emission at selected wavelengths, for example, a He—Ne or ND-YAG laser. The light source may be configured to operate in a continuous or pulsed mode.

One or more convex focusing lenses 274a, 274b may be used to focus the incident light beam 276 to the area 280 on the substrate surface, and to focus the return light beam 278 back on the active surface of photodetector 270. The area 280 should be sufficiently large to compensate for variations in surface topography of the substrate 220 and device design features. This enables detection of etch endpoints for high aspect ratio features having small openings, such as vias or deep narrow trenches, which may be densely present or more isolated. The area of the return light beam should be sufficiently large to activate a large portion of the active light-detecting surface of the photodetector 270. The incident and return light beams 276, 278 are directed through a transparent window 210 in the process chamber 10 that allows the light beams to pass in and out of the processing environment.

Optionally, a light beam positioner 284 may be used to move the incident light beam 276 across the substrate 220 to locate a suitable portion of the substrate surface on which to position the beam spot 180 to monitor an etching process. The light beam positioner 284 may include one or more primary mirrors 286 that rotate at small angles to deflect the light beam from the light source 266 onto different positions of the substrate surface. Additional secondary mirrors may be used (not shown) to direct the return light beam 278 on the photodetector 270. The photodetector 270 comprises a light-sensitive electronic component, such as a photovoltaic cell, photodiode, or phototransistor, which provides a signal in response to a measured intensity of the return light beam 278. The signal can be in the form of a change in the level of a current passing through an electrical component or a change in a voltage applied across an electrical component. The photodetector 270 can also comprise a spectrometer (array detector with a wavelength-dispersive element) to provide data over a wide wavelength range, such as ultraviolet to visible, from about 200 nm to 800 nm. The return light beam 278 undergoes constructive and/or destructive interference which increases or decreases the intensity of the light beam, and the photodetector 270 provides an electrical output signal in relation to the measured intensity of the reflected light beam 278. The electrical output signal is plotted as a function of time to provide a spectrum having numerous waveform patterns corresponding to the varying intensity of the reflected light beam 278.

A computer program on a computer system 272 compares the shape of the measured waveform pattern of the reflected light beam 278 to a stored characteristic (or reference) waveform pattern and determines the endpoint of the etching process when the measured waveform pattern is the same as the characteristic waveform pattern. As such, the period of the interference signal may be used to calculate the depth and etch rate. The program may also operate on the measured waveform to detect a characteristic waveform, such as, an inflection point. The operations can be simple mathematic operations, such as evaluating a moving derivative to detect an inflection point.

The computer program utilizes the inverse characteristic of the signal interfacing with the photoresist to remove or cancel out the contribution of the signal interfacing with the photoresist, thus allowing the signal interfacing with the target layer being etched to be more accurately analyzed to determine the endpoint of the etched target layer.

FIGS. 3A-3D are illustrative of how the inverse characteristic of the signal interfacing with the photoresist can be cancel out to allow the signal interfacing with the target layer to be more accurately analyzed. Although FIGS. 3A-3D are taken utilizing signals interfaces with the photoresist layer in a transmission mode, data taken using a reflectance mode is similar in character.

Figure 3A:
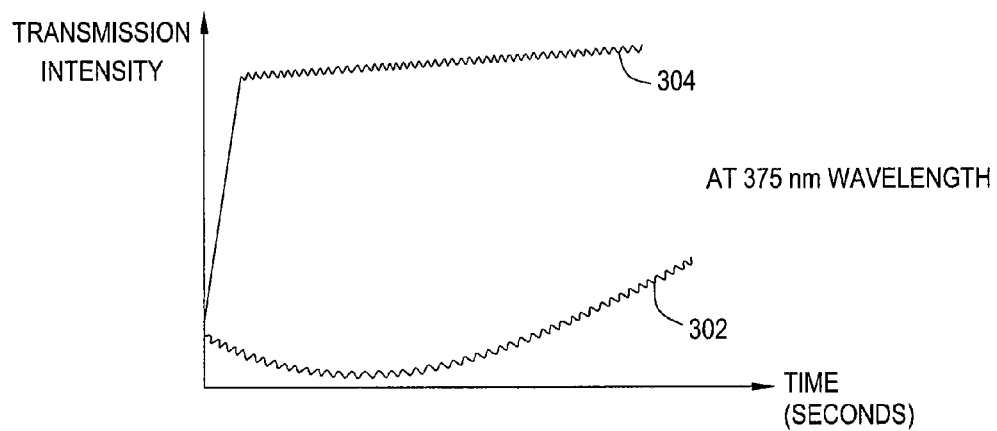
FIGS. 3A-3D are illustrative plots of various optical signals used for endpoint detection during a photomask fabrication process.

FIG. 3A depicts a plot of two optical signals monitored at a first wavelength of 375 nm as a function of time during an etching process as detected by the endpoint detection system. In the exemplary embodiment depicted herein, the etching process is performed to etch a metal containing layer, such as a chromium-containing (Cr) layer. The chromium layer may be etched using a plasma containing chlorine and oxygen gases. During etching, the photoresist layer or other surrounding layers disposed on the chromium (Cr) layer may be etched and/or consumed as well as the chromium (Cr) layer. Thus, the optical signal utilized for endpoint detection interfaces with both the Cr and photoresist layers. The signal interfacing with the photoresist layer is different than the signal interfacing with Cr layer. The top trace 304 is obtained by monitoring a transmittance signal interfaced with the Cr layer at a wavelength of 375 nm. As the chromium containing layer is etched, the chromium-containing layer exposed in the open areas as well as the photoresist layer becomes thinner. The transmittance signal intensity of the signal interfacing with the Cr layer increases approaching an endpoint as the chromium-containing layer exposed in the open area of the photoresist is gradually removed. The transmittance signal intensity of the signal interfacing with the photoresist layer also changes while approaching the endpoint as the photoresist is slightly removed or eroded while etching Cr layer.

As shown in FIG. 3A, after a period of etching time, about 50 Å of chromium has been etch to reveal the underlying layer, the transmittance signal intensity of the chromium containing layer reaches to a maximum point and flattens out, indicating clearance of the chromium and exposure of the underlying quartz layer. As the transmittance intensity of the Cr signal trace levels off indicating that the Cr layer has been cleared, the endpoint is considered achieved.

The bottom trace 302 is obtained by monitoring a transmittance signal originating from a photoresist layer disposed on the Cr layer at the same wavelength of 375 nm. As the thickness of the photoresist layer may be gradually diminished during the etching process, the transmittance signal obtained during the process may vary.

Figure 3B:
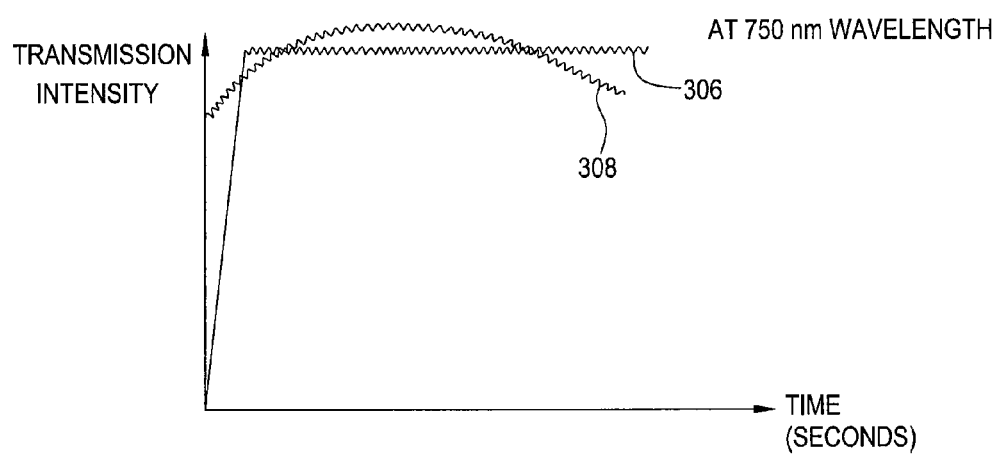

FIG. 3B depicts optical signals monitored at a second wavelength of 750 nm as a function of time during the same metal containing layer etching process (Cr layer etching process) described above with referenced to FIG. 3A. Similar to the transmittance signal detected at the first wavelength of 375 nm depicted in FIG. 3A, the first trace 306 is obtained by monitoring a transmittance signal passing through the Cr layer at a wavelength of 750 nm. The endpoint signal of the chromium-containing layer has a similar transmittance signals in both wavelength of 375 nm and 750 nm. The second trace line 308 is obtained by monitoring a transmittance signal passing through the photoresist layer disposed on the Cr layer at the same wavelength of 750 nm. As compared to the transmittance signal trace shown by the bottom trace 302 depicted in FIG. 3A, the transmittance signals for the photoresist layer detected at different wavelength, e.g., at 375 nm and at 750 nm, have an inverse transmittance characteristics. The second trace line 308 depicts a high transmittance intensity of the photoresist layer during the etching process at the wavelength of 750 nm.

Figure 3C:
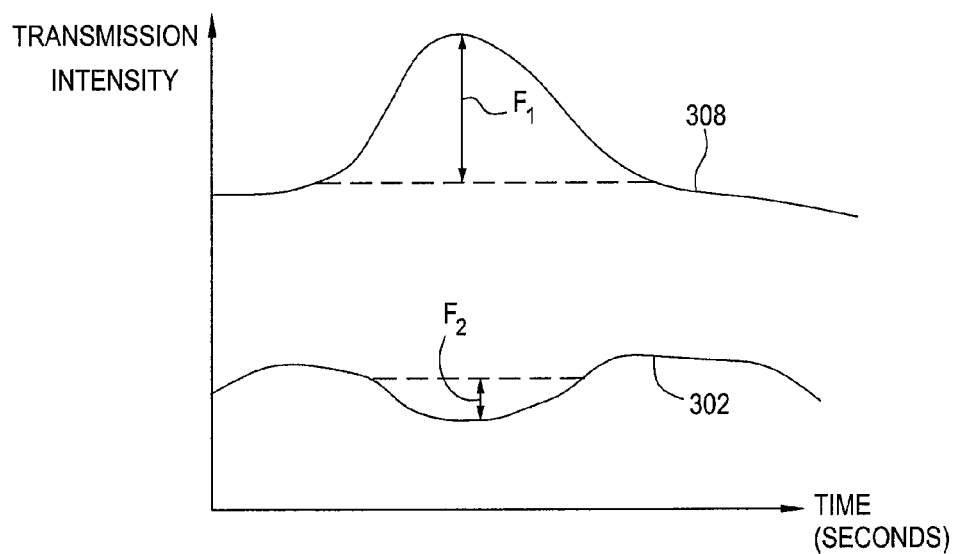

Accordingly, by combining the detected transmittance signals of the photoresist layer at both wavelength of 375 nm and 750 nm, interference from the photoresist transmittance signal may be efficiently reduced, removed and cancelled out, leaving predominantly the Cr transmission signals for determination of endpoint detection. FIG. 3C depicts a plot of the two optical signals, shown as traces 302, 308, obtained at 375 nm and 750 nm wavelength interfaced with the photoresist layer during an etching process. As discussed above, during an etching process, the transmittance signals as detected by the endpoint detector may come from any materials from the substrate, such as a Cr layer, a photoresist layer or other surrounding layers. Different kinds of transmittance signals as received by the endpoint detector system may interfere each other, thereby adversely impacting on the accuracy of determining a process endpoint based on the mixture of detected signals. Therefore, by collecting transmittance signals of a photoresist layer at wavelengths which produce an inverse signal characteristic, signals which may interfere with analysis of a signal relating to the target material may be cancelled out using a mathematical computation or other process to allow a more accurate determination of an endpoint (or thickness) of the target material, such as a Cr layer, during an etching process.

It is noted that amplitude F1 at the second trace line 308 obtained at the 750 nm wavelength is less than the amplitude F2 at the bottom trace 302 obtained at the 375 nm wavelength. Accordingly, an amplitude scaling factor may be used to compensate for the difference in amplitude such that the inverse characteristics may be summed to zero, thus cancelling out the effect of signal interfacing with the photoresist. In one embodiment, the scaling factor may be in a range between about 1 to 10. The scalying fact will depend on the wavelength dependence of the transmission of reflection of the layer being etched For applications having a photoresist thickness of about 400 Å or greater, the scaling factor is about 2. For applications having a photoresist thickness of less than about 400 Å, the scaling factor is may be empirically determined or calculated.

Figure 3D:
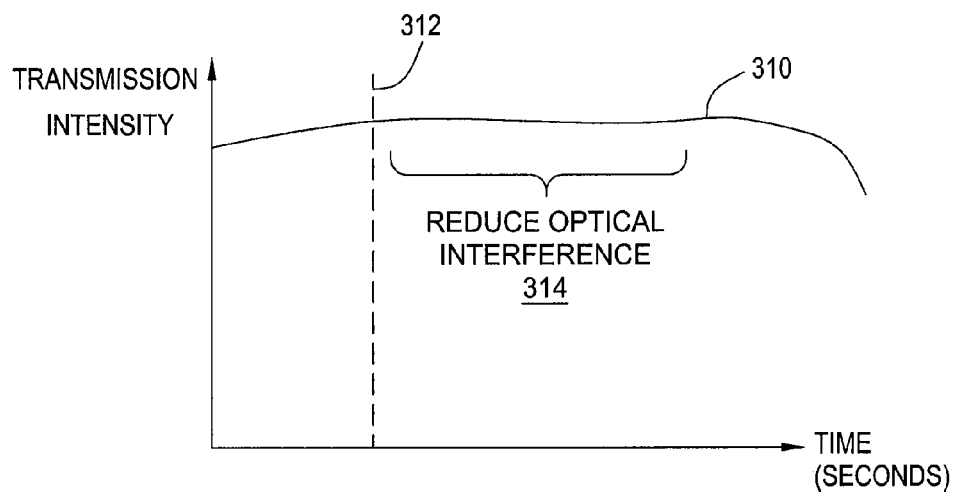

FIG. 3D depicts a resultant signal 310 of the combined optical transmittance signals represented by traces 302, 308 of the photoresist layer at wavelength 375 nm and wavelength 750 nm during the Cr etching process, with the lower signal represented by bottom trace 302 scaled to allow cancellation of the signal interfacing with the photoresist layer. Accordingly, the photoresist transmittance interference portion of the signal 310 as detected is significantly reduced, thereby allowing a more accurate analysis of the target signal (e.g., the signal interfacing with the Cr layer) to be made. The removal of the interference of the portion of the signal attributed to interfacing with photoresist is particularly important in mask etch or other application where the signal interfacing with the target material is particularly weak and easily overshadowed by noise.

Figure 4:
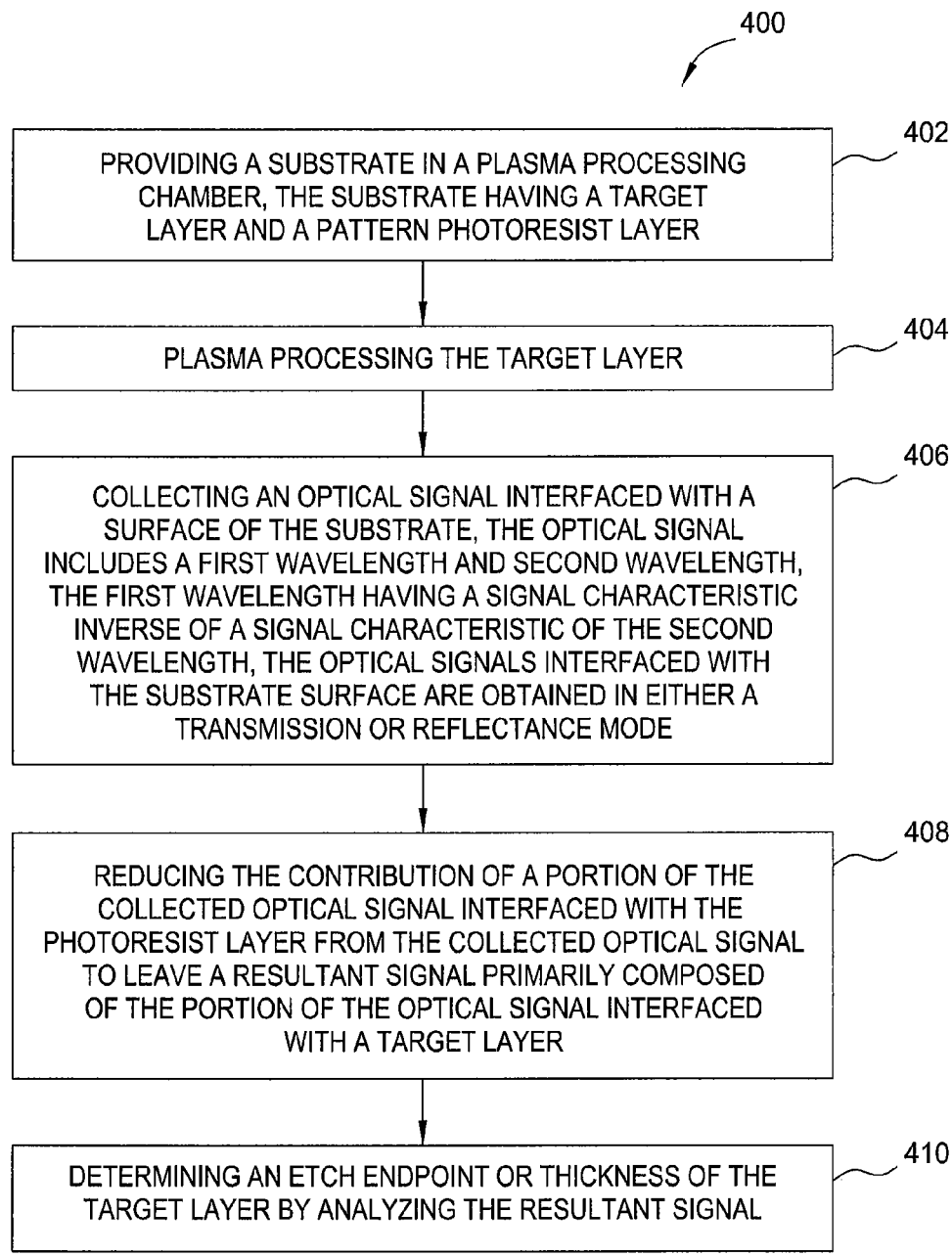
FIG. 4 is a flow diagram of one embodiment of a process for etching a photomask.
Figure 5A:
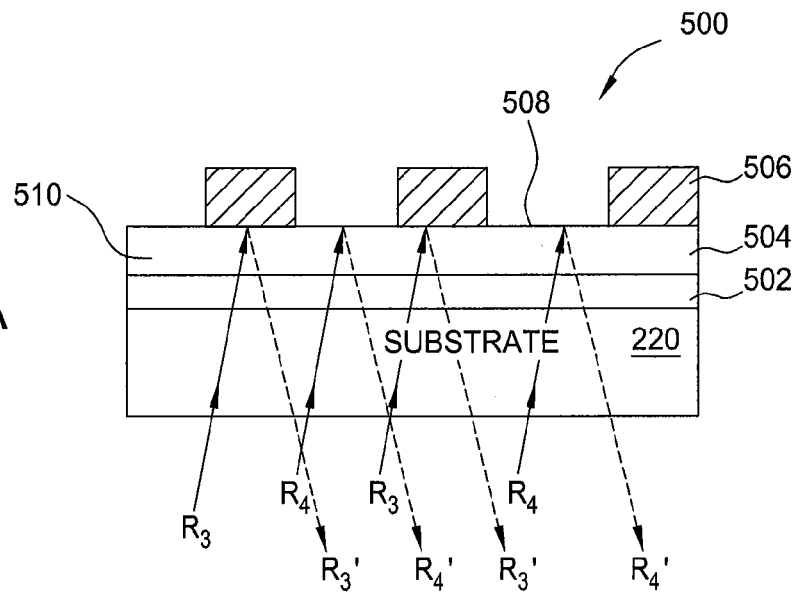
FIGS. 5A-5C are illustrate schematically structures of several types of photomasks during fabrication.
Figure 5B:
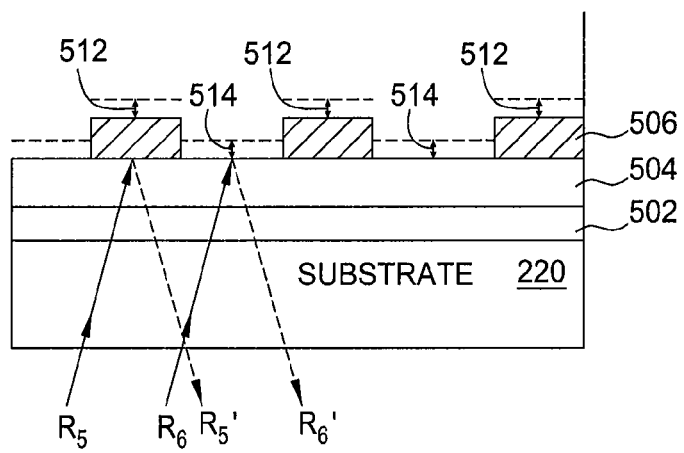
Figure 5C:
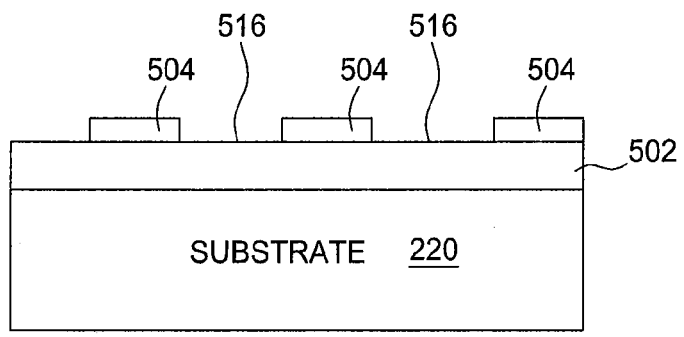

FIG. 4 depicts a process 400 for monitoring a target layer in a plasma processing chamber wherein a photoresist is present on or above the target layer. The exemplary 400 is illustrated as a photomask etch process in FIGS. 5A-5C while illustrate cross-sectional views of a photomask during different stages of the fabrication process. Although FIGS. 5A-5C depict a reflection mode of operation, a transmission mode of operation, such as illustrated in FIGS. 3A-3D, may be practiced using the method 400 as set forth in FIG. 4. It is also contemplated that the method 400 may be utilized to monitor a target layer in other applications.

The method 400 starts at a block 402 where a substrate 220 is provided into a plasma processing chamber having an endpoint detector coupled to a substrate support assembly. For example, the plasma processing chamber may be the etch chamber 10 depicted in FIG. 2. Alternatively, the plasma processing chamber may be any suitable chamber, including those available from other manufactures, that may be utilize to plasma etch a photomask or substrate, or plasma process other structure.

The exemplary substrate 220 may have a phase shifting layer 502 and a metal containing layer 504 consecutively formed on the substrate 220, as depicted in FIG. 5A. In one embodiment, the substrate 220 may be a quartz layer, a glass layer, a transparent layer or any other suitable layers. The phase shifting layer 502 may be a Mo, MoSi, $MoSiO_xN_y$, or other suitable layer. Alternatively, the layer 502 may also be an absorbing layer that assists absorbing light at a desired range of wavelength. The metal containing layer 504 may be a chromium-containing layer, such as Cr, CrO, or CrON layer. A patterned photoresist layer 506 may be formed on the metal containing layer 504 to define open areas 508 to expose the underlying metal containing layer 504 for etching so as to form a photomask 500.

At block 404, a plasma process is performed on the target layer of substrate 220. During the plasma etch process, an optical signal is interfaced with the substrate surface. The optical signal includes at least a first wavelength and a second wavelength, wherein the first wavelength has a signal characteristic inverse of a signal characteristic of the second wavelength when interfaced with the photoresist layer. As discussed above, the optical signal may be generated by the plasma or another light source.

The plasma process may be performed to etch the target layer, such as the metal containing layer 504, using the patterned photoresist layer 506 as an etch mask layer to define open areas 508 for etching. During etching, a process gas is introduced into the chamber after the substrate is disposed on the substrate support assembly in the etch chamber. Halogen-containing gases are typically used for etching different materials found on the photomask structure. For example, a process gas containing chlorine may be used for etching the metal containing layer 504, such as a chromium containing layer, while a fluorine-containing gas such as trifluoromethane ($CHF_3$) or tetrafluoromethane ($CF_4$) may be used for etching quartz, such as the substrate 202. For example at block 404, optical signals shown as R3, R4 may be directed to the substrate 220 from its backside to later be utilized to detect the thickness and critical dimension of the structures of the photomask 500 formed on the substrate 220 during etching, as depicted in FIG. 5A.

At block 406, optical signals interfaced with the substrate surface are collected. The collected optical signals may be either in a transmission or reflectance mode.

At block 408, the contribution of a portion of the collected optical signal interfaced with the photoresist layer is reduced from the collected optical signal to leave a resultant signal primarily composed of the portion of the optical signal interfaced with a target layer. The contribution may be reduced by summing a characteristic of the optical signal interfaced with the photoresist layer to about zero as described above.

At block 406, the signal detection process may be continuously performed during the etching process, including the period of prior to the etching process, as depicted in FIG. 5A, and the period during the etching process, as depicted in FIG. 5B or after the etching process, as depicted in FIG. 5C. Prior to the etching process, the optical signals R3', R4' reflected from the substrate are collected as a reference point so as to compare with the later detected signals during and/or after the etching process. As discussed above, the reflective signal R3' and R4' interface with both the metal containing layer 504 and the photoresist layer 506.

During the etching process, the metal-containing layer 504 exposed in the open area 508 is gradually etched away, as shown by dash line 514 as depicted in FIG. 5B. However, a portion of the thickness of the photoresist layer 506 may be consumed as well during the etching process, as shown by dash line 512. Accordingly, as the detected signals may include both the signals R5', R6' interfaced with both the photoresist layer 506 and the metal containing layer 504, the combined signal as detected may interfere the endpoint or thickness determination processes, thereby diminishing accuracy of the determination.

At block 408, the contribution of a portion of the collected optical signal interfaced with the photoresist layer is reduced from the collected optical signal to remove the undesired signals so as to assist determining an accurate process endpoint or target material thickness. In one embodiment, the wavelengths utilized to interface with the photoresist layer are in range between about 200 nm and about 800 nm. In one embodiment, the first wavelength is about 375 nm while the second wavelength is about 750 nm. At the selected wavelengths, the signal characteristics of the portion of the signals interfacing with the photoresist layer are inverse, which allow them to be cancelled out using a mathematical calculation or other method to leave a resultant signal primarily composed of the portion of the optical signal interfaced with a target layer. As noted above, an amplitude scaling factor is utilized to sum the characteristics of the wavelengths interfacing with the photoresist to zero.

At block 410, an etch endpoint or thickness of the target layer may be determined by analyzing the resultant signal. As the resultant signal is substantially free of noise associated with the photoresist layer, a more accurate endpoint or thickness determination may be obtained.

For example, the resultant signal may be utilized at block 410 to provide an accurate indication of the target etched material, such as the metal containing layer 504, for use in thickness and endpoint determination. The analysis of the resultant signal may be performed to estimate the etch profile of a chromium feature, and to terminate the etch process when the foot of the chromium feature is cleared. Such analysis will allow the control of the etch profile of the feature.

Similar to chromium etching, the etch endpoint and/or thickness for Mo-containing layers can be monitored in either reflection or transmission mode. Background signals, or other unwanted signals associated with the photoresist may also be cancelled as discussed above.

By applying one or more optical measurement techniques for simultaneous monitoring at the substrate with broad range (or multiple specific) of wavelengths, embodiments of the present invention provide an improved apparatus and method with enhanced process monitoring and control capabilities. These improvements also allow reliable endpoint detection for photomask etching applications with accurate endpoint prediction.

While the foregoing is directed to embodiments of the present invention, other and further embodiments of the invention may be devised without departing from the basic scope thereof, and the scope thereof is determined by the claims that follow.

What is claimed is:

1. A method for monitoring a target material in a plasma process, comprising:
    directing, during a plasma process on a substrate having a target material and a patterned photoresist layer disposed thereon, an optical signal to a surface of the substrate;
    collecting the optical signal interfaced with the substrate surface, the collected optical signal including at least a first wavelength and a second wavelength, wherein the first wavelength has a signal characteristic inverse of a signal characteristic of the second wavelength;
    reducing a contribution of a portion of the collected optical signal interfaced with the photoresist layer from the collected optical signal to leave a resultant signal primarily composed of the portion of the optical signal interfaced with the target layer; and
    determining an etch endpoint or thickness of the target layer from the resultant signal.

2. The method of claim 1, wherein collecting further comprises:
    collecting the optical signal at wavelengths ranging from about 200 nm to about 800 nm.

3. The method of claim 1, wherein first wavelength is about 375 nm and the second wavelength about 750 nm.

4. The method of claim 1, wherein a wavelength of the first wavelength is about twice a wavelength of the second wavelength.

5. The method of claim 1, wherein signal characteristic is selected from a group comprising intensity and polarization.

6. The method of claim 1, wherein analyzing the collected optical signal further comprises:
    determining the undesired optical signal from the obtained optical signal by collecting the optical signals at two or more wavelengths.

7. The method of claim 6, wherein reducing a contribution of a portion of the collected optical signal interfaced with the photoresist layer further comprises:
    summing a characteristic of the first and second wavelengths to about zero.

8. The method of claim 7, wherein summing a characteristic of the first and second wavelengths to about zero further comprises:
    scaling the characteristic one of the first and second wavelengths.

9. The method of claim 8, wherein scaling further comprises:
    scaling the characteristic one of the first and second wavelengths by a factor between 1 to 10.

10. The method of claim 8, wherein scaling further comprises:
    scaling the characteristic one of the first and second wavelengths by a factor which allows the characteristic of the wavelengths to be summed to about zero.

11. The method of claim 1, wherein collecting further comprises:
    collecting first and second wavelengths generated by a plasma utilized to process the target material.

12. The method of claim 1, wherein collecting further comprises:
    collecting first and second wavelengths generated by a light source.

13. The method of claim 1, wherein collecting further comprises:
    collecting first and second wavelengths reflecting from the surface of the substrate.

14. The method of claim 1, wherein collecting further comprises:
    collecting first and second wavelengths transmitting through the surface of the substrate.

15. A method for monitoring a target material during a plasma process comprising:
    directing, during a plasma process on a substrate having a target material and a patterned photoresist layer disposed thereon, an optical signal to a surface of the substrate;
    collecting the optical signal interfaced with the substrate surface, the collected optical signal including at least a first wavelength and a second wavelength, the first wavelength selected to have an inverse characteristic to the second wavelength when interfaced with the photoresist layer;
    reducing a contribution of a portion of the collected optical signal interfaced with a photoresist layer from the collected optical signal by summing a characteristic of the optical signal interfaced with a photoresist layer to about zero to leave a resultant signal primarily composed of the portion of the optical signal interfaced with a target layer; and
    determining an etch endpoint or thickness of the target layer from the resultant signal.

16. The method of claim 15, wherein collecting further comprises:
   collecting the optical signal through a first window in a center region and a second window in a peripheral region of a member supporting the substrate.

17. The method of claim 15, wherein the target material is at least one a phase shifting layer, an absorber layer or a chromium-containing layer.

18. The method of claim 15, wherein collecting further comprises:
   collecting first and second wavelengths generated by a plasma utilized to process the target material.

19. The method of claim 15, wherein reducing further comprises:
   scaling the characteristic one of the first and second wavelengths by a factor which allows the characteristic of the wavelengths to be summed to about zero.

20. The method of claim 15, wherein the first wavelength has a wavelength different than a wavelength of the second wavelength by a factor between 1 to 10.

* * * * *